United States Patent
Luan et al.

(10) Patent No.: US 6,635,110 B1
(45) Date of Patent: Oct. 21, 2003

(54) CYCLIC THERMAL ANNEAL FOR DISLOCATION REDUCTION

(75) Inventors: Hsin-Chiao Luan, Cambridge, MA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/603,572

(22) Filed: Jun. 23, 2000

Related U.S. Application Data

(60) Provisional application No. 60/141,142, filed on Jun. 25, 1999.

(51) Int. Cl.$^7$ .............................. C30B 1/00; C50B 29/08
(52) U.S. Cl. ........................ 117/4; 117/5; 117/8; 117/9; 117/936
(58) Field of Search ............................... 117/4, 5, 8, 9, 117/936

(56) References Cited

U.S. PATENT DOCUMENTS

| | | | |
|---|---|---|---|
| 4,632,712 A | | 12/1986 | Fan et al. |
| 5,091,333 A | * | 2/1992 | Fan et al. ............... 437/82 |
| 5,091,767 A | | 2/1992 | Bean et al. |
| 5,168,330 A | | 12/1992 | Vitkavage et al. |
| 5,210,052 A | | 5/1993 | Takasaki |
| 6,130,144 A | * | 10/2000 | Verret ................... 438/510 |
| 6,184,144 B1 | | 2/2001 | Lo |

FOREIGN PATENT DOCUMENTS

JP 09/180999 * 7/1997

OTHER PUBLICATIONS

Switch et al, "Atom–rearrangment in Ge layer grown on Si substrate". Journal of Crystal Growth vol. 150(1–4) pt 2 pp. 955–9 (Abs only), 1995.*

Sheldon et al., Dislocation density reduction through annihilation in lattice mismatched semiconductors grown by molecular–beam epitaxy, *J. Appl. Phys*, vol. 63, No. 11, pp. 5609–5611, Jun. 1988.

Yamaguchi, et al., "Defect reduction effects in GaAs on Si substrates by thermal annealing," *Appl. Phys. Lett.*, vol. 52, No. 23, pp. 2293–2295, Dec. 1988.

Fitzgerald, "The effect of substrate growth area on misfit and threading dislocation densities in mismatched heterostructures," *J. Vac. Sci. Technol. B*, vol. 7, No. 4, pp. 782–788, Jul./Aug. 1989.

(List continued on next page.)

*Primary Examiner*—Robert Kunemund
(74) *Attorney, Agent, or Firm*—Theresa A. Lober

(57) ABSTRACT

The invention provides processes for producing a very low dislocation density in heterogeneous epitaxial layers with a wide range of thicknesses, including a thickness compatible with conventional silicon CMOS processing. In a process for reducing dislocation density in a semiconductor material formed as an epitaxial layer upon a dissimilar substrate material, the epitaxial layer and the substrate are heated at a heating temperature that is less than about a characteristic temperature of melting of the epitaxial layer but greater than about a temperature above which the epitaxial layer is characterized by plasticity, for a first time duration. Then the epitaxial layer and the substrate are cooled at a cooling temperature that is lower than the about the heating temperature, for a second time duration. These heating and cooling steps are carried out a selected number of cycles to reduce the dislocation density of the epitaxial layer.

29 Claims, 13 Drawing Sheets

OTHER PUBLICATIONS

Tachikawa et al., "Film thickness dependence of dislocation density reduction in GaAs–on Si substrates," *Appl. Phys. Lett.*, vol. 56, No. 5, pp. 484–486, Jan. 1990.

Yamaguchi et al., "Analysis for dislocation density reduction in selective area grown GaAs films on Si substrates," *Appl. Phys. Lett.*, vol. 56, No. 1, pp. 27–29, Jan. 1990.

Yamaguchi et al., Thermal annealing effects of defect reduction in GaAs on Si mismatched semiconductors grown by molecular–beam epitaxy, *J. Appl. Phys*, vol. 63, No. 11, pp. 5609–5611, Jun. 1998.

Cunningham et al., "Heteroepitaxial growth of Ge on (100) Si by ultrahigh vacuum, chemical vapor deposition," *Appl. Phys. Lett.*, vol. 59, No. 27, pp. 3574–3576, Dec. 1991.

Sakai et al., "Ge growth on Si using atomic hydrogen as a surfactant," *Appl. Phys. Lett.*, vol. 64, No. 1, pp. 52–54, Jan. 1994.

Takagi et al., "Reduction Mechanism of Threading Dislocation Density in GaAs Epilayer Grown on Si Substrate by High–Temperature Annealing," *Jpn, J. Apply Phys.*, vol. 33, Part 1, No. 6A, pp. 3368–3372, Jun. 1994.

Roos et al., "Thermal–stress–induced dislocations in GeSi/Si heterostructures," *J. Crystal Growth*, vol. 137, pp. 457–471, 1994.

Sutter et al., "Thin film photodetectors grown epitaxially on silicon," *Solar Energy Materials and Solar Cells*, vol. 31, pp. 541–547, 1994.

Knall et al., "Threading dislocations in GaAs grown with free sidewalls on Si mesas," *J. Vac. Sci. Technol. B*, vol. 12, No. 6, pp. 3069–3074, Nov./Dec. 1994.

Saitoh et al., "Atom–rearrrangement in Ge layer grown on Si Substrate during anneal observed in real time by coaxial impact collision ion scattering spectroscopy," *J. Cryst. Growth*, vol. 150, pp. 955–959, 1995.

Tamura et al., "Rearrangement of misfit dislocations in GaAs on Si by post–growth annealing," *J. Cryst. Growth*, vol. 150, pp. 654–660, 1995.

Speck, et al., "Scaling laws for the reduction of threading dislocation densities in homogeneous buffer layers," *J. Appl. Phys.*, vol. 80, No. 7, pp. 3808–3816, Oct. 1996.

Romanov et al., "An approach to threading dislocation 'reaction kinetics'," *Appl. Phys. Lett.*, vol. 69, No. 22, pp. 3342–3344, Nov. 1996.

Colace et al., "Ge/Si (001) Photodetector for Near Infrared Light," *Solid State Phenomena*, vol. 54, pp. 55–58, 1997.

Soga et al., "MOCVD growth of high efficiency current–matched AlGaAs/Si tandem solar cell," *J. Cryst. Growth*, vol. 174, pp. 579–584, 1997.

Sakai et al., "Growth of strain–relaxed Ge films on Si(001) surfaces," *Appl. Phys. Lett.*, vol. 71, No. 24, pp. 3510–3512, Dec. 1997.

Currie et al., "Controlling threading dislocation densities in Ge on Si using graded SiGe layers and chemical–mechanical polishing," *Appl. Phys. Lett.*, vol. 72, No. 14, pp. 1718–1720, Apr. 1998.

Masini et al., "High responsivity near infrared Ge photodetectors integrated on Si," *Electronics Letts.*, vol. 35, No. 17, pp. 1467–1468, Aug. 1999.

Luan et al., "High–quality Ge epilayers on Si with low threading–dislocation densities," *Appl. Phys., Lett.*, vol. 75, No. 19, pp. 2909–2911, Nov. 1999.

Masini et al., "Ge–on–Si high responsivity near–infrared photodetectors," in *Silicon–based Optoelectronics II*, Robbins et al., Eds., SPIE vol. 3953, pp. 103–109, Jan. 2000.

Colace et al., Efficient high–speed near–infrared Ge photodetectors integrated on Si substrates, *Appl. Phys. Lett.*, vol. 76, No. 10, pp. 1231–1233, Mar. 2000.

* cited by examiner

CYCLIC THERMAL ANNEAL FOR DISLOCATION REDUCTION

CROSS REFERENCE TO RELATED APPLICATION

This application claims the benefit of U.S. Provisional Application No. 60/141,142, filed Jun. 25, 1999, the entirety of which is hereby incorporated by reference.

This application is related to co-pending application entitled "Oxidation of Silicon on Germanium," U.S. Ser. No. 09/603,269, filed on even date herewith, now issued as U.S. Pat. No. 6,352,942, and incorporated by reference in its entirety.

BACKGROUND OF THE INVENTION

This invention relates to heteroepitaxial layer processing techniques, and more particularly relates to techniques for improving characteristics of heteroepitaxial layers.

The heteroepitaxial deposition of various III–V and II–VI semiconductors, and particularly germanium (Ge), on silicon (Si) substrates is a research topic of significant technological importance. Successful heteroepitaxial Ge deposition on silicon enables a wide range of optical communication systems and components. A particularly important application is the integration of fast, efficient, low noise Ge photodetectors on Si. Ge photodetectors have the ability to detect light efficiently at the optical communication wavelengths of 1.3 μm and 1.54 μm. Integration of Ge detectors with a conventional silicon fabrication process enables production of optical communication systems at the chip level. Specifically, integration of Ge photodetectors on Si with polysilicon waveguide technology enables Si optical interconnect systems. Such a silicon optical interconnect system, or Si microphotonic system, has been suggested by the Semiconductor Industry Association as a means for overcoming metal interconnect limitations. Integration of Ge on Si also has the ability to enhance current MOSFET technology. Because Ge has higher carrier mobility than Si, Ge FET or MOSFET devices fabricated on a silicon substrate provide higher current capability, lower power consumption, lower temperature operation and higher speed than the corresponding silicon devices. Such a Ge FET integrated on a Si substrate can be used in "system on a chip" applications and can enable electronic devices for a wide range of applications. Ge on Si can also replace indium gallium arsenide devices integrated with indium phosphide substrates in the field of near infrared imaging.

The integration of Ge on Si has historically proven to be difficult due to a range of technical challenges. In particular, germanium epi-layers grown on silicon are generally found to suffer from sub-optimal mechanical and electrical characteristics, including high surface roughness due to island formation and high sessile threading dislocation density.

It is generally understood that the formation of Ge islands and the generation of misfit dislocations as a Ge epi-layer is grown on a silicon wafer are due to the 4% lattice mismatch between Ge and Si. Both island formation and misfit dislocation generation are nature's ways of reducing the strain energy associated with the lattice mismatch. Island formation results in large roughness of the top surface of the epitaxial layer. Such surface roughness can obstruct process integration of Ge devices with Si devices, e.g., by disabling accurate photolithographic processes, and by reducing the ability to produce functional multiple metal interconnect layers.

Misfit dislocations are not harmful to semiconductor devices per se because these dislocations are generally constrained to the Ge/Si interface. Misfit dislocations can relax strain between Ge and Si and are beneficial to the stability of the materials system. But the generation of misfit dislocations results in the formation of threading dislocations that connect the misfit dislocations at the Ge/Si interface to the top surface of the Ge epi-layer. Threading dislocations degrade device characteristics, for example, by increasing the leakage current of a rectifying junction and thereby reducing the efficiency of a photodetector. It has accordingly been recognized that both island formation and threading dislocations should be avoided in a Ge epi-layer.

It is well understood that during epitaxial growth of Ge on Si, island formation occurs to relax misfit energy. It has been suggested that by growing Ge on Si at a temperature below about 375° C., island formation could be prevented. Growth of Ge on Si at such a low temperature results in a low film growth rate, however. Growth of a layer of a commercially useful thickness, for example 1 μm-thick or more, at low temperatures would require a prohibitive process time not commercially feasible as a practical matter.

Reduction of threading dislocations in a Ge epi-layer grown on Si has also been problematic with conventional processing techniques. It has been suggested that threading dislocations in a two-material system of mismatch greater than about 2% cannot be reduced to densities below about $10^9$ cm$^{-2}$. Specifically, it has been conventionally understood that in a large-mismatch, two-material system such as Ge—Si, the products of reactions between glissile dislocations in the epi-layer material are sessile dislocations. Once formed, sessile dislocations cannot be removed per se. It has thus been generally understood that the primary technique for growing a high-quality Ge epi-layer on Si with low threading dislocation density is to preserve the glissile dislocation structure by producing an epi layer of relatively low mismatch with the silicon substrate. This has led to efforts at growing relatively thick, e.g., greater than about 12 μm-thick, graded SiGe buffer layers on Si to produce a high-quality top surface epi-layer region. It has been found, however, that the growth of thick, graded buffer layers results in a high degree of surface roughness that effectively blocks threading dislocation motion, i.e., the dislocations cannot be rendered glissile.

A chemomechanical polishing (CMP) process has been suggested to reduce surface roughness to enable dislocations to glide. Another method proposed to reduce threading dislocation density in highly mismatched two-material systems is a so-called "epitaxial necking" method. This process is based on the fact that sessile dislocations are inclined. Therefore, by growing a thick layer of Ge in small holes on patterned SiO$_2$/Si wafers, it is suggested that threading dislocations can be filtered out. For such a process to be enabled, an epi-layer thickness greater than the maximum lateral dimension of the small holes is necessary. Like the "grading" growth method described above, the "epitaxial necking" growth method requires growth of a thick layer of Ge to achieve a high quality Ge layer with low threading dislocation density.

It is well-recognized that thick-layer Ge epi-layer growth techniques like those just described are very difficult to integrate with Si CMOS processing technology due to the much greater thickness of the Ge epi-layer relative to the generally very thin CMOS Si and other microelectronic layers. A variety of techniques have been proposed to ease the integration of Ge on Si by addressing one or the other of the dislocation and surface roughness problems separately.

As just discussed, methods for reduction of threading dislocation defects at the top active layer of a thick Ge epi-layer have been proposed, and separately, methods for reducing interface misfit dislocation defects have been developed.

But both the nucleation of interface defects and the reduction and elimination of threading dislocation defects both at the epi-layer top surface and through intermediate regions between the top surface and the epi-substrate interface are required. A Ge epi-layer sufficiently thin to be compatible with Si CMOS integration is, for current conventional growth processes, characterized by an unacceptably high density of threading defects at the top surface as well as regions between top surface and the epi-substrate interface. Lacking a process that addresses all of these requisite materials issues, it has not been commercially feasible as a practical matter to integrate high-quality Ge epi-layers on Si for integration with conventional Si CMOS processes.

SUMMARY OF THE INVENTION

The invention provides processes for producing a very low dislocation density in heterogeneous epitaxial layers with a wide range of thicknesses, including a thickness compatible with conventional silicon CMOS processing.

Specifically, the invention provides a process for reducing dislocation density in a semiconductor material formed as an epitaxial layer upon a dissimilar substrate material. In the process, the epitaxial layer and the substrate are heated at a heating temperature that is less than about a characteristic temperature of melting of the epitaxial layer but greater than about a temperature above which the epitaxial layer is characterized by plasticity, for a first time duration. Then the epitaxial layer and the substrate are cooled at a cooling temperature that is lower than the about the heating temperature, for a second time duration. These heating and cooling steps are carried out a selected number of cycles to reduce the dislocation density of the epitaxial layer.

The processes of the invention enable, in contrast to conventional expectation, transformation of sessile threading dislocations formed during the epi-layer growth into glissile threading dislocations by the cyclic heating and cooling. It is discovered by the inventors herein that in contrast to conventional understanding, glissile dislocation annihilation is enabled by this cyclic heating and cooling to reduce threading dislocation density. This understanding is applied to the process of the invention to enable such where the epitaxial layer is, e.g., between about 1 $\mu$m and about 10 $\mu$m in thickness. Alternatively, the epitaxial layer can as thin as no more than about 1 $\mu$m in thickness.

In one example implementation of the heating and cooling cycles, the heating temperature is preferably no less than about 10% below the characteristic melting temperature of the epitaxial layer. In a further example implementation, the heating temperature is preferably no less than about 100° C. below the characteristic melting temperature of the epitaxial layer, more preferably no less than about 50° C. below the characteristic melting temperature, and most preferably no less than about 10° C. below the characteristic melting temperature.

The cooling temperature, in one example implementation, is at least about 50° C. less than the heating temperature; in a further example, the cooling temperature is about ambient temperature. The cooling temperature alternatively can be selected to maximize thermally-induced glide of dislocations and to minimize glide limitation by a glide energy barrier characteristic of the epitaxial layer.

The heating and cooling steps are preferably carried out at least once. In one example, the number of cycles for which the heating and cooling is carried out is between one and twenty cycles. Preferably, the number of heating and cooling cycles, as well as the duration of the cycles, are each less than that at which substantial material diffusion between the substrate and the epitaxial layer materials would occur. The heating and cooling durations can be substantially equal, and for many applications, preferably are at least as long as a characteristic duration required for the epitaxial layer and the substrate to reach thermal equilibrium. The heating and cooling cycles can be carried out in any suitable atmosphere, e.g., an inert atmosphere.

In accordance with the invention, the epitaxial layer can include a III–V material, a II–VI material, or other suitable material. In one example, the epitaxial layer includes germanium (Ge) and the substrate is a silicon (Si) substrate. Here silicon devices can be fabricated on the silicon substrate. The temperature of the heating cycle for this example is preferably at least about 900° C. and the cooling temperature for this example is preferably between about 700° C. and about 900° C. The number of heating and cooling cycles for this Ge—Si example is preferably selected to produce a dislocation density no greater than about $2\times10^7$ cm$^{-2}$.

In embodiments provided by the invention, the epitaxial layer can include at least one epitaxial mesa adjacent to which is provided a dislocation sink material. The epitaxial mesa can be, e.g., a circular mesa, a square mesa, having an extent, e.g., of less than about 20 $\mu$m, or other suitable geometry. In an example where the epitaxial material is Ge and the substrate is Si, the dislocation sink material can be provided as silicon dioxide. For this example, the number of heating and cooling cycles can be selected to produce a substantially zero dislocation density in the mesa.

In accordance with the invention, the epitaxial layer can be formed by chemical vapor deposition or other suitable process. In one particularly well-suited chemical vapor deposition process, the epitaxial layer is deposited at a first deposition temperature for a first deposition duration selected to form at least a mono-epitaxial layer and then is deposited at a second deposition temperature for a second deposition duration selected to form the epitaxial layer.

The cyclic heating and cooling process of the invention can be advantageously employed where the epitaxial layer is Ge and a lateral photodetector is to be fabricated in the Ge epitaxial layer. Similarly, a vertical photodetector can be fabricated in the Ge epitaxial layer. These are a few examples of the wide range of devices that are rendered commercially viable by the processes of the invention. Other features and advantages of the invention will be apparent from the description to follow and the accompanying drawings, and from the claims.

DETAILED DESCRIPTION OF THE INVENTION

The processes provided by the invention substantially reduce or completely eliminate threading dislocation defects at both the top, active surface of a heterogeneous epitaxial layer (epi-layer), e.g., a Ge layer, and at intermediate regions between the top surface and the interface of the epi-layer with an underlying substrate, e.g., a silicon substrate. The processes will be described as-related to a Ge epi-layer and a silicon substrate, but as discussed in more detail below, are not limited to such and are applicable to a wide range of materials.

In accordance with the invention, an epi-layer, such as a Ge epi-layer, is formed on a silicon substrate by a selected deposition process, such as that provided by the invention and described below, to a desired thickness. Preferably, the epi-layer thickness is compatible with conventional silicon microfabrication processes, in which case the thickness is about 1 $\mu$m or less.

Figure 1:
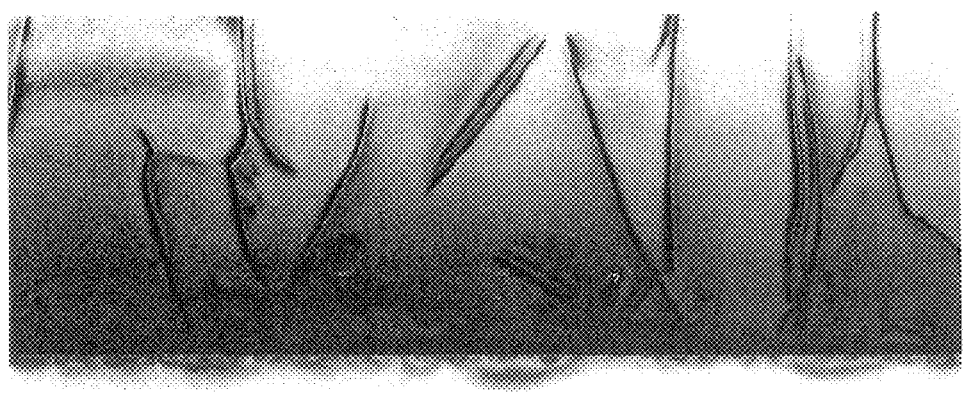
FIG. 1 is a cross-sectional transmission electron micrograph (TEM) of a germanium (Ge) epi-layer grown on a silicon (Si) substrate by a two-step UHV/CVD process provided by the invention.

FIG. 1 is a cross-sectional transmission electron micrograph (TEM) of a 1 $\mu$m-thick Ge epi-layer grown on a bare Si wafer. The layer was grown by a two-step ultra-high vacuum chemical vapor deposition (UHV/CVD) process provided by the invention on a 4" p-Si (001) wafer. In a first growth step, Ge was grown at a temperature of about 350° C. and a flow rate of about 10 sccm of $GeH_4$ (15% in Ar) for about 6 hours. Then in a second step, the furnace temperature was raised to 600° C. The Ge layer growth was then continued at 600° C. under the same $GeH_4$ flow rate for 6 more hours. To the naked eye, the upper surface of the resulting Ge layer was specular, indicating that the Ge layer as-grown on the Si substrate was characterized by a low surface roughness. The root-mean-square surface roughness was found generally to be below about 2 nm across the wafer. This is a value previously thought to be impossible for a growth temperature above 375° C. without inclusion of a grading SiGe layer.

A high density of threading dislocations can be observed in Ge epi-layer in the TEM of FIG. 1. Also to be noted is that the 4% lattice mismatch between the Ge epi-layer and the Si substrate is relaxed by nucleation of misfit dislocation at the Ge/Si interface. The relaxation of the strain is generally understood to increase the stability of the two-material system and to prevent inter-diffusion of Ge and Si and the related introduction of defects in later processing.

The threading dislocations in the Ge epi-layer shown in the TEM of FIG. 1 are highly unstable sessile threading dislocations. In accordance with the invention, it has been discovered that these unstable sessile threading dislocations can be transformed into glissile threading dislocations and substantially or completely annihilated by a cyclic thermal anneal that alternates in temperature between a high anneal temperature, $T_H$, and a low anneal temperature $T_L$, where $T_H > T_L$. Alternating of the anneal temperature between the two selected temperatures is continued for a selected number cycles, with each temperature stage being of a selected duration. The high and low anneal temperatures, the duration of high- and low-temperature anneal stages, and the number of anneal cycles are selected in accordance with the invention to minimize the dislocation density of the epi-layer.

Figure 2A:
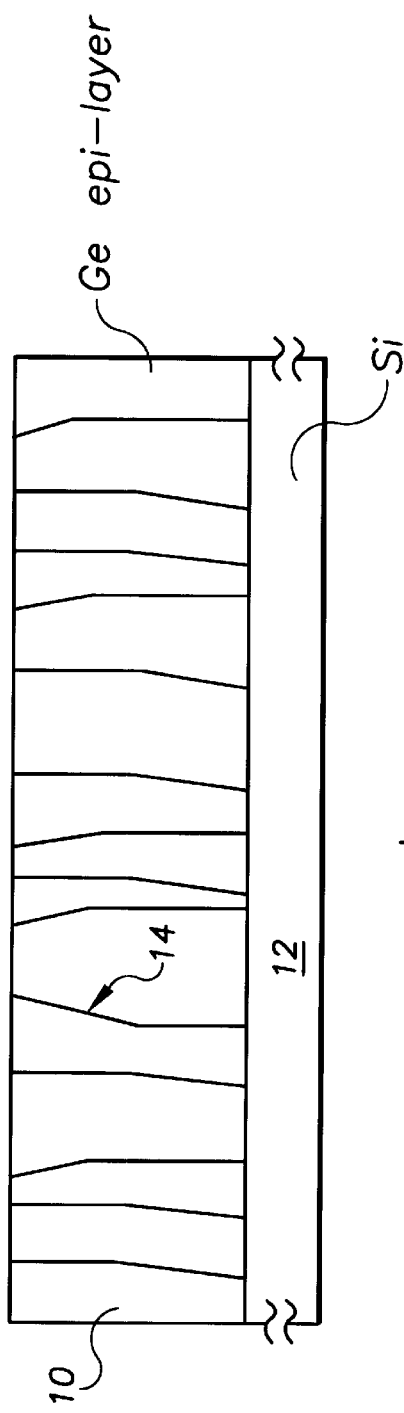
FIGS. 2A–2B are schematic cross-sectional diagrams of a threading dislocation defect reduction mechanism enabled by the processes of the invention.
Figure 2B:
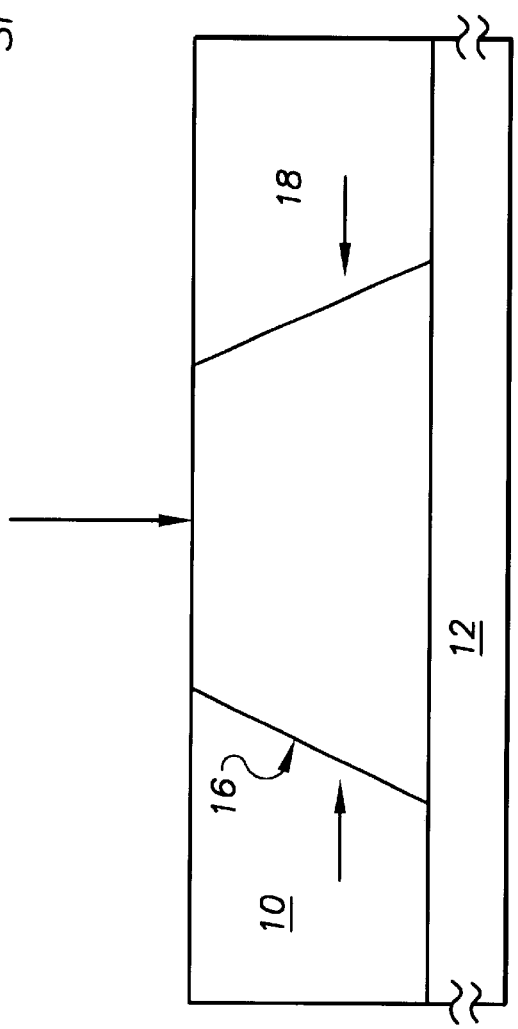

FIGS. 2A–2B schematically represent one dislocation reduction mechanism enabled by the cyclic thermal anneal process of the invention. In an as-grown Ge epi-layer 10 formed on a silicon substrate 12, there exists a high density of sessile threading dislocations 14. The substantially vertical geometry of the dislocations is an indication that they are sessile and of their high degree of instability. In the course of exposure of the Ge-epi layer to the cyclic thermal annealing process of the invention, during each high-temperature stage of the anneal, a percentage of the unstable threading dislocations are transformed to glissile threading dislocations 16. These glissile threading dislocations can glide under the influence of thermal stress.

The change in temperature between a high-temperature anneal stage and a low-temperature anneal stage in the annealing cycle produces thermal stress. This stress generates a force 18 causing the glissile threading dislocations to move; in many cases such movement is toward another dislocation. The reaction of two gliding dislocations is found in accordance with the invention to be annihilation of the dislocations, in contrast to conventional wisdom. The cyclic annealing process of the invention thereby enables a reduction in sessile threading dislocation density by transformation from sessile to glissile threading dislocation and by thermal stress-induced glissile dislocation glide and resulting annihilation.

A second dislocation reduction mechanism is additionally enabled by the invention. Given that dislocation glide is induced by thermal stress imposed by the annealing cycle, there is to be provided, in accordance with the invention, dislocation sinks adjacent to epi-layer regions and to which the dislocations can glide. Such dislocation sink features can be provided adjacent to epi-layer regions, e.g., in which devices are to be fabricated. Glide of the dislocations from the epi-layer regions to the dislocation sinks "empties" the regions of dislocations. The dislocation annihilation mechanism described above can also occur during dislocation glide toward a sink region. As a result, as discussed in detail below, with such a configuration, device-designated epi-layer regions adjacent to the one or more dislocation sinks can be rendered substantially dislocation-free by a suitable anneal cycle sequence.

The invention contemplates a wide range in geometry and material composition of the dislocation sinks. Preferably, the dislocation sink material is compatible with the selected epi-layer growth and anneal processes. For example, given Ge epi-layer growth on a silicon substrate, a layer of silicon dioxide can be provided on the silicon substrate and patterned to expose the silicon substrate in isolated windows etched out of the silicon dioxide layer. Because Ge will not grow on the silicon dioxide layer, the windows define epi-layer growth mesas. The windows can be circular, rectangular, or other geometry. Given the dislocation glide mechanism, a circular window geometry can be preferred for many applications.

The size of the Ge epi-layer mesas is preferably determined based on a given application, but also based on a desired dislocation density. As can be recognized, as the extent of an isolated Ge epi-layer mesa is reduced, the dislocation density of the mesa is correspondingly reduced due to the shortened distance through which a dislocation must glide to reach the sink from central regions of the mesa. Accordingly, and as discussed in more detail below, the mesa extent is preferably selected based on a dislocation density to be achieved for a given application. The size of the silicon dioxide window for producing mesa can be, e.g., between about 2 μm and about 100 μm; an opening of less than about 20 μm, and more than 10 μm, is preferred, to provide adequate device fabrication area. The invention contemplates a wide range of additional dislocation sink configurations for defining a device region in an epi-layer.

Based on the dislocation reduction mechanisms provided by the invention, the high temperature, $T_H$, of the high-temperature anneal stage in the anneal cycle is preferably selected to enhance climb and cross-slip of sessile dislocations. In general, the high temperature is selected to maximize sessile dislocation energy such that transformation to glissile dislocations occurs. Preferably, the high temperature is greater than the highest temperature employed during epi-layer growth, and preferably higher than the temperature at which the epi-layer is plastic; most preferably, the high temperature is as close to the melting temperature of the epi-layer as possible. For many applications, the high temperature preferably is no lower than about 10% less than the epi-layer melting temperature, or no lower than about 100° C. below the epi-layer melting temperature.

It is to be recognized that the melting point of a material varies with doping, alloy content, and characteristics of the substrate material, among other considerations. The high anneal temperature therefore is selected for a given application based on the particular process conditions of the material under consideration. Germanium is characterized by a melting temperature of about 939° C., and is plastic at a temperature above about 600° C. Therefore, for a Ge epi-layer, it is preferred that the temperature of the high-temperature anneal stage be close to about 939° C. and no less than about 839° C. If such cannot be accommodated by a given anneal apparatus, the high temperature should be no lower than about 600° C. In another example, gallium arsenide is characterized by a melting temperature of about 1240° C. and is plastic at a temperature above about 1000° C. Therefore, for a GaAs epi-layer, it is preferred that the temperature of the high-temperature anneal stage be close to about 1240° C. and no less than about 1140° C. If such cannot be accommodated by a given anneal apparatus, the high temperature should be no lower than about 1116° C. or 1000° C. at the lowest.

The temperature of the low-temperature anneal stage is selected to be less than that of the high temperature stage and preferably is selected to maximize the thermally-induced glide velocity of glissile dislocations. A relatively higher glide velocity results in an increase in the distance a dislocation travels during a given anneal cycle. This increased travel distance in turn increases the probability of dislocation annihilation events, and increases the probability of glide to a dislocation sink. It is therefore found in accordance with the invention that an increased dislocation glide velocity enhances the rate of dislocation density reduction.

Dislocation glide velocity can in general be described with the following expression:

$$V_{dislocation} = V_o \cdot \sigma_{exc} \cdot \exp\left(-\frac{E_v}{kT}\right); \quad (1)$$

where $V_{dislocation}$ is the dislocation velocity, $V_o$ is a constant, $\sigma_{exc}$ is the excess stress driving dislocation motion, $E_v$ is the energy barrier to dislocation glide, k is the Boltzmann constant, and T is the temperature.

In a thermal annealing cycle of a Ge epi-layer in accordance with the invention, as the temperature is reduced from that of the high-temperature stage, at, e.g., about 900° C., to that of the low-temperature stage, at, e.g., about 780° C., thermal stress between the Ge epi-layer and the Si substrate is induced due to the difference in coefficients of thermal expansion (CTE) between Ge and Si. This thermal stress, $\sigma_t$, can be described by the following expression:

$$\sigma_t = (\alpha_{Si} - \alpha_{Ge}) \cdot (T_H - T_L) \cdot \frac{2 \cdot (1+v)}{(1-v)} \cdot \mu; \quad (2)$$

where $\alpha_{Si}$ and $\alpha_{Ge}$ are the CTE of Si and Ge, respectively v is the Poisson ratio, and $\mu$ is the Young's modulus of Ge. Excess stress in the two-material system is then given as the thermal stress minus the dislocation line tension stress. Because dislocation line tension stress is not strongly related to temperature and is much smaller than the thermal stress, expressions (1) and (2) above can be combined to indicate the dislocation velocity as the following expression:

$$V_{dislocation} \propto (\alpha_{Si} - \alpha_{Ge}) \cdot (T_H - T_L) \cdot \exp\left(-\frac{E_v}{kT_L}\right). \quad (3)$$

Expression (3) indicates that there are two processes controlling dislocation velocity, namely, thermal stress and the dislocation glide energy barrier. Thermal stress increases as the temperature, $T_L$, of the low-temperature stage is reduced. The dislocation glide energy barrier, on the other hand, tends to prevent dislocation glide as the temperature is reduced. Maximization of the dislocation velocity therefore requires a balance between thermal stress and opposing glide energy barrier.

Figure 3:
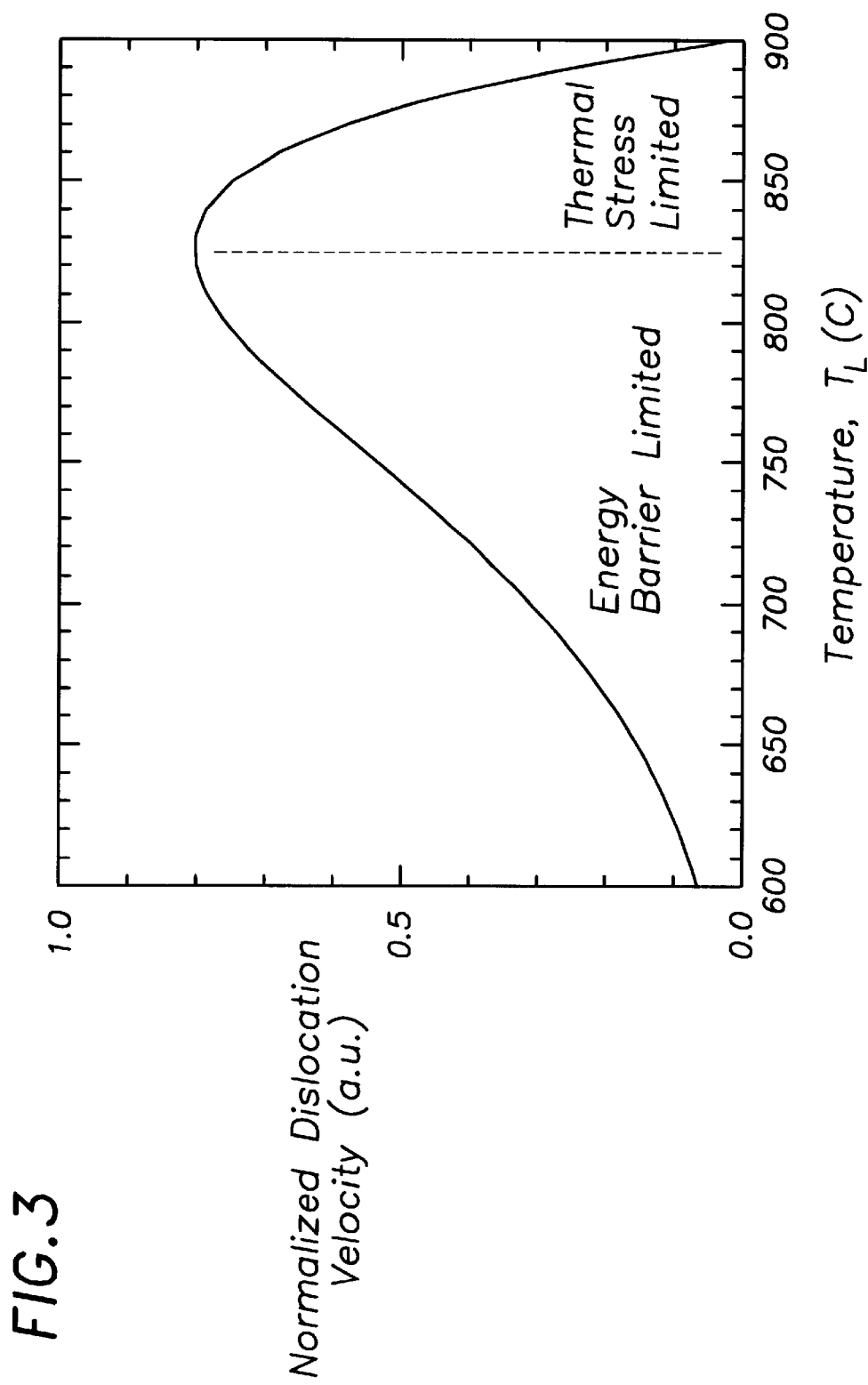
FIG. 3 is a plot of calculated normalized dislocation velocity as a function of the temperature of a low-temperature thermal anneal stage provided by the invention.

FIG. 3 is a plot of calculated normalized velocity of dislocations in a Ge epi-layer on a Si substrate as a function of the temperature, $T_L$, of the low-temperature anneal stage in the cyclic annealing process of the invention. These calculations assume that the system is relaxed at a high-temperature stage temperature, $T_H$, of about 900° C. As indicated by the plot, at temperatures below about 830° C., the glide velocity is limited by the glide energy barrier, while at temperatures above about 830° C., the glide velocity is limited by a reduction in thermal stress. Accordingly, based on this data, for many applications an optimized cyclic Ge thermal annealing process employs a low temperature, $T_L$, of about 830° C.

This $T_L$ temperature optimization example for a Ge epi-layer demonstrates how to select the low temperature such that it is low enough to induce substantial thermal stress while at the same time being high enough to overcome the glide energy barrier. In general, for any epi-layer-substrate material system of interest, the invention contemplates an analysis of glide energy barrier and thermally-induced stress particular to that system such that an optimized low temperature that balances the two opposing forces to maximize dislocation glide velocity is prescribed. The expressions given above are general and are not limited to a Ge—Si system.

Although an optimized low temperature is preferred, such is not absolutely required by the invention. In general the low-temperature stage of the cycle is preferably at least about 50° C. lower than the high-temperature stage of the cycle, and can be as low as ambient temperature.

Considering cycle and cycle stage duration, each cycle in the cyclic annealing process can be described as including a high-temperature stage of a first duration, $D_H$, followed by a low-temperature stage of a second duration, $D_L$. The first and second durations can be identical or distinct, and can be altered over the course of multiple cycles. The minimum duration for a given anneal stage is preferably determined based on the characteristics of the chamber in which the anneal is carried out. For example, if a rapid thermal annealing chamber is employed, a relatively short stage duration can be employed. In general, the minimum stage duration is that duration required for the epi-layer and substrate to reach thermal equilibrium during a given stage. There is no specific upper limit on stage duration, but diffusion of the substrate constituent into the epi-layer is preferably avoided. For example, after a relatively long anneal time, Si can diffuse into an overlying Ge epi-layer, and such is to be avoided.

The invention does not require a particular number of anneal cycles, so long as at least one anneal cycle is carried out, i.e., at least one high-temperature stage and one low-temperature stage are completed. As the number of anneal cycles is increased, the potential for inter-material diffusion increases and as explained just above, such is to be avoided. It is therefore preferred for a given application that the number of anneal cycles be restricted to that for which diffusion cannot occur.

The cyclic anneal technique of the invention is preferably carried out in a chamber under inert gas conditions, e.g., with a flow of argon or other inert gas. The process can be carried out in vacuum or in any suitable flow of gas as-prescribed for a given material system. For example, in a cyclic anneal process for GaAs, it is preferred that an As over pressure be maintained during the anneal stages to inhibit decomposition of the GaAs.

At the start of the anneal process, the epi-layer-substrate system is loaded into the chamber at room temperature or other selected temperature, and the chamber temperature is raised to the selected high-temperature stage temperature, $T_H$. No particular thermal ramp rate is required in accordance with the invention, but it is to be recognized that ramp rates above some critical rate can result in damage to a substrate; such is to be avoided. The high-temperature stage is thereafter set to begin at the point when the selected high anneal temperature is reached within the chamber.

At the end of the high-temperature stage, the temperature is then ramped down to the selected low-temperature stage temperature, $T_L$. The low-temperature stage is set to begin at the point when the ramping downward in temperature begins. No particular downward ramp rate is required by the invention. Typically, the temperature of the epi-layer-substrate configuration drops very rapidly. For example, in a rapid thermal anneal furnace, the temperature of the configuration can drop from 900° C. to 780° C. in less than one second. In a hot wall furnace, such a temperature drop requires less than about ten seconds. The downward ramp time is therefore typically a very small fraction of the low-temperature stage duration.

If multiple anneal cycles are to be carried out, then at the end of the low-temperature stage, the chamber temperature is then ramped to that selected for the next high-temperature stage. How ever many cycles are to be completed, the last cycle is preferably ended with a low-temperature stage. If the temperature of the low-temperature stage was not ambient, the chamber is then ramped down to ambient and then removed from the chamber.

It is recognized in accordance with the invention that the heating and cooling stages of the anneal process cycles need not necessarily be imposed by the ramping of the temperature at a single furnace location. Alternatively, the substrate can be transferred between zones in a multi-zone furnace in which each zone is set at a selected high or low anneal temperature. Similarly, the substrate can be transferred between chambers in a multi-chamber system where each chamber is controlled at a selected high or low anneal temperature.

As explained above, the epi-layer to be annealed can be produced by any selected process. It is preferred in accordance with the invention that the epi-layer growth produce nucleation of misfit dislocations at the epi-layer-substrate interface to relax strain. Such relaxation of the strain is generally understood to increase the stability of the two-material system and to prevent inter-diffusion between the materials.

Figure 4A:
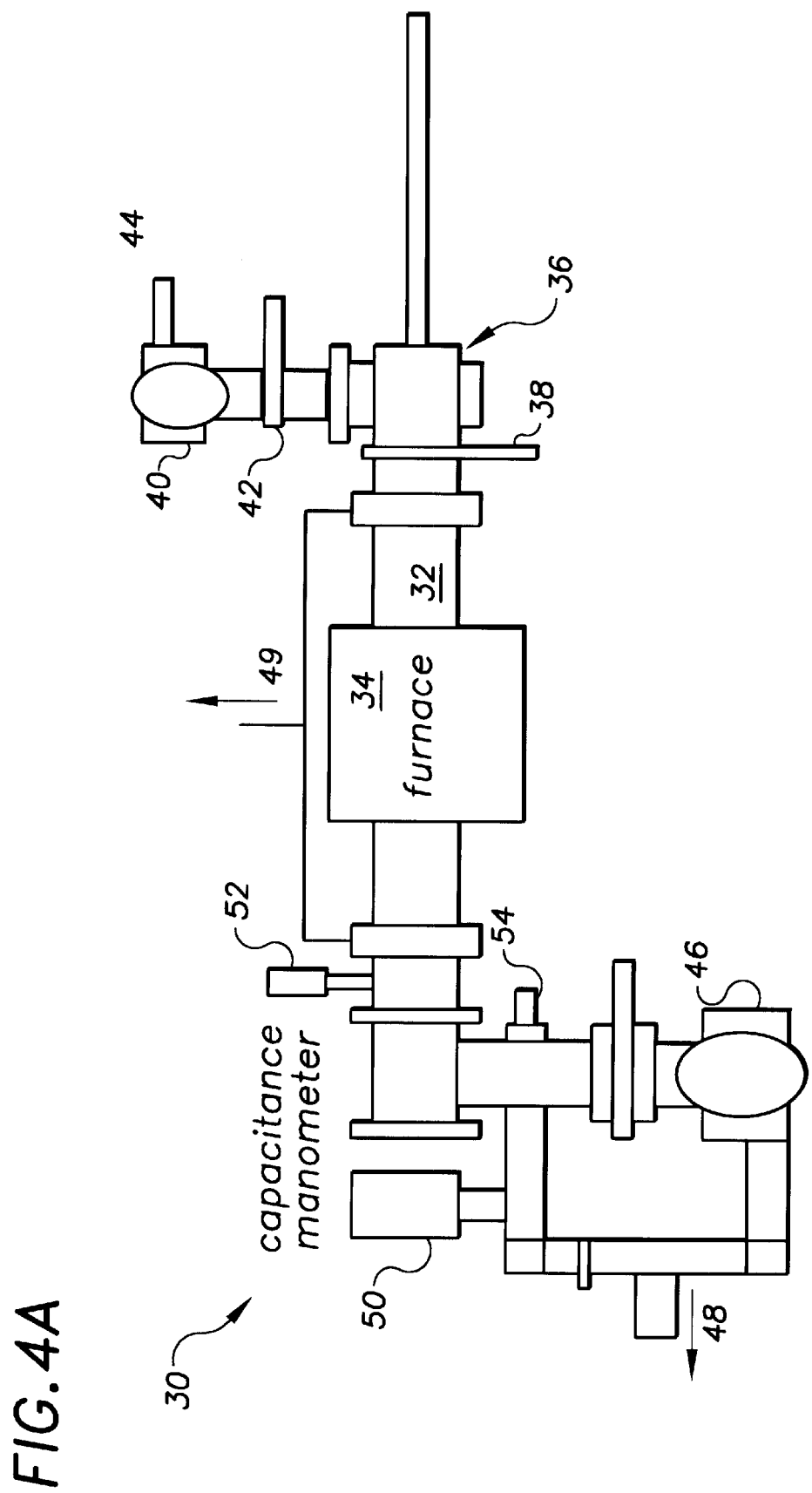
FIGS. 4A–4B are schematic representations of a UHV/CVD system and its gas manifold, respectively, utilized for the epi-layer growth method of the present invention.

One example Ge epi-layer growth process provided by the invention can be particularly well-suited for many applications due to its ability to produce very low surface roughness even on relatively thin epi-layers. Referring to FIG. 4A, there is shown an example UHV/CVD system 30 for carrying out this Ge epi-layer growth on a silicon substrate. The UHV/CVD system includes a quartz reaction chamber 32, a furnace 34, which surrounds the quartz reaction chamber, and a load lock chamber 36. The furnace and the load lock chamber may be any of a number of suitable UHV/CVD systems known in the art. The typical base pressure for the reaction chamber of the UHV/CVD system is around $2 \times 10^{-9}$ Torr. The base pressure of the load lock chamber is typically about $10^{-7}$ Torr. The furnace controls the reaction chamber temperature to a prescribed process temperature. A manual gate valve 38 isolates the load lock chamber from the reaction quartz chamber. The load lock chamber is connected to a turbo molecular pump 40 via a pneumatic gate valve 42. The turbo molecular pump for the load lock chamber is backed by a mechanical pump 44. The quartz reaction chamber is also pumped by a turbo molecular pump 46. The reaction chamber turbo molecular pump is backed by a roots pump 48 and a mechanical pump 49. A residual gas analyzer 50, a capacitance manometer 52, and an ion pressure gauge 54 can be connected, if desired, to the reaction chamber to measure the total and partial pressure of gaseous species in the quartz reaction chamber.

Figure 4B:
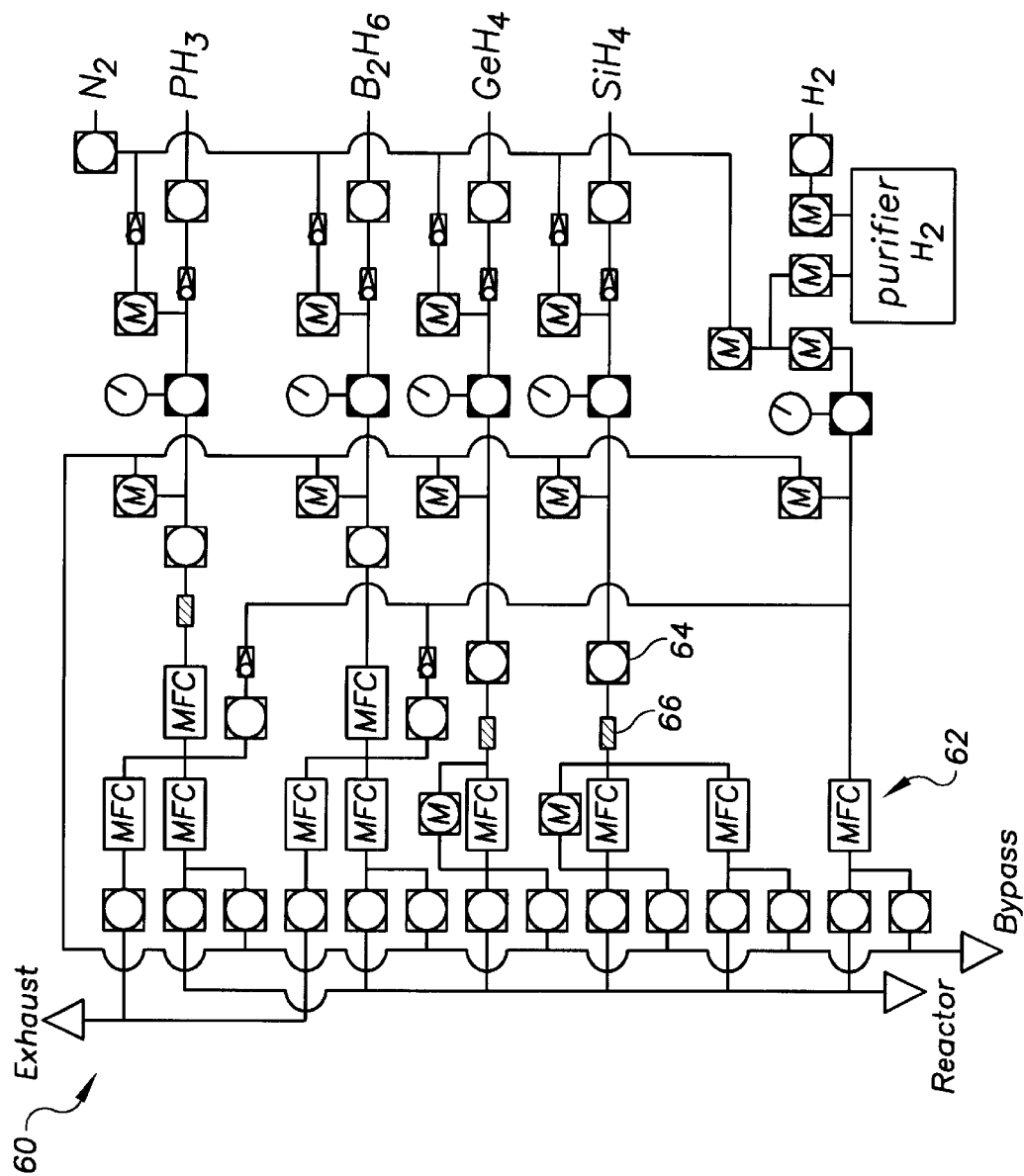

Reaction gases are provided to the quartz chamber from the gas manifold 60 diagrammatically shown in FIG. 4B. The gas manifold supplies gases such as $SiH_4$, $GeH_4$, $B_2H_6$, $PH_3$, $H_2$ and $N_2$ to the reaction chamber. A mass flow controller 62 and pneumatic valves 64 are provided to control the flow of reaction gases. Several in-line purifiers 66 are provided to ensure the supply clean gases into the reaction chamber.

In a process for growth of Ge epi-layers, silicon wafers are first cleaned. If it is desired to grow Ge epi-layer mesas on a Si wafer having a patterned oxide layer to act as dislocation glide sinks, then the starting Si wafers are oxidized in a typical oxidation furnace; both wet and dry oxidation techniques are suitable. A suitable oxide thickness is, e.g., about 1 µm. The oxide layer is preferably thick enough to at least partially remain after subsequent HF cleaning steps. The $SiO_2$ layer on Si is then patterned using, e.g., conventional photolithographic techniques to produce, e.g., circular, square, or rectangular openings in the oxide layer surfaces by etching processes, e.g., a buffered oxide etch solution or a plasma etching system. After the oxide layer is patterned, the wafers are then cleaned, e.g., in a conventional piranha solution ($H_2SO_4$: $H_2O_2$=3:1) for about 10 minutes. After wafer cleaning, the wafers are then preferably dipped in a dilute HF solution (HF: $H_2O$=1:5) for 10–15 seconds to strip any native oxide on the on the silicon surface. Bare Si wafers on which a Ge epi-layer is to be grown are preferably cleaned using a suitable cleaning process such as this.

Prior to loading of the cleaned wafers in the growth chamber, the gas manifold is set to bleed a surfactant gas, e.g., $H_2$ gas, at about 10 sccm through the reactor line into the quartz reaction chamber. The pressure in the reaction chamber is raised to about 3 mTorr. The temperature of the furnace is then set to be maintained at a selected temperature for the first growth step, e.g., at a temperature between about 275° C. and about 375° C. A temperature of about 350° C. is preferred. The cleaned wafers are placed on a wafer boat and placed in the load lock chamber. Placing the boat into the load lock chamber results in the pressure inside the load lock chamber rising to atmosphere pressure. The load lock chamber is then evacuated by both the mechanical pump and the turbo molecular pump connected to the load lock chamber. When the load lock chamber pressure is below about $10^{-5}$ Torr, the gate valve between the load lock chamber and the quartz reaction chamber is opened and the wafer boat is transferred to the center of the quartz reaction chamber. The flow of $H_2$ in the reaction chamber is preferred to reduce cross contamination between the two chambers during this wafer transfer process. During the wafer boat transfer process, the pressure of the quartz reaction chamber is maintained at about $10^{-3}$ Torr by the reactor turbo molecular pump, the roots pump and the reactor mechanical pump.

Next, the gate valve between the load lock chamber and the quartz reaction chamber is closed. The $H_2$ flow in the reaction chamber is then stopped. Next, flow of a Ge growth gas, e.g., $GeH_4$, is initiated at, e.g., between about 10 sccm and about 100 sccm, with about 10 sccm of $GeH_4$ preferable, (15% in Ar) in the reaction chamber. The total pressure during this step is held at about 15 mTorr. This growth step produces slow epi-layer growth with very little, if any, island formation due to the hydrogen surfactant flow. If a very thin, e.g., about 20 nm-thick, epi-layer is desired, the growth process can be ended at a suitable time during this growth step.

If a thicker Ge epi-layer is desired, then after a suitable thickness, e.g., about 20 nm of Ge is grown, typically taking about 6 hours, a second, high growth rate step, is then carried out. For this step, the furnace temperature is raised to a higher temperature, e.g., between about 500° C. and about 700° C., preferably about 600° C., to grow a thicker Ge layer on the thin epi-layer just formed at a faster growth rate than the first step. This high-temperature growth rate is about 150 nm/hr. The growth rate can be adjusted, as can be recognized, by correspondingly adjusting the $GeH_4$ partial pressure; e.g., increase of the $GeH_4$ partial pressure increased the growth rate.

EXAMPLE 1

A 1 µm-thick Ge epi-layer was grown on a silicon substrate by the two-step UHV/CVD process described above. The silicon substrate was p-type Si (100) with a resistivity in the range of about 0.5–2 Ω-cm. Before heteroepitaxy, the Si wafer was cleaned in piranha solution ($H_2SO_4$: $H_2O_2$=3:1) for 10 minutes. Native oxide was removed by dipping the wafer in an aqueous HF solution (HF: $H_2O$=1:5) for 15 seconds. 10 sccm flow of hydrogen was maintained as the substrate was loaded into the chamber. Then the hydrogen flow was terminated and heteroepitaxy of Ge on Si was initiated at 350° C. with a flow of 10 sccm of $GeH_4$ (15% in Ar). The total pressure during Ge heteroepitaxy was 15 mTorr. After 30 nm of Ge was deposited on Si, the furnace temperature was raised to 600° C. and 1 µm of Ge was deposited on Si.

The resulting Ge epi-layer was then subjected to the cyclic thermal annealing process provided by the invention. Ten annealing cycles were carried out. The high-temperature stage temperature, $T_H$, was about 900° C. and of a duration, $D_H$, of about 5 minutes; the low-temperature stage temperature, $T_L$, was about 780° C. and of a duration, $D_L$, of about 5 minutes. These stage temperatures and durations were employed for all ten anneal cycles.

Figure 5:
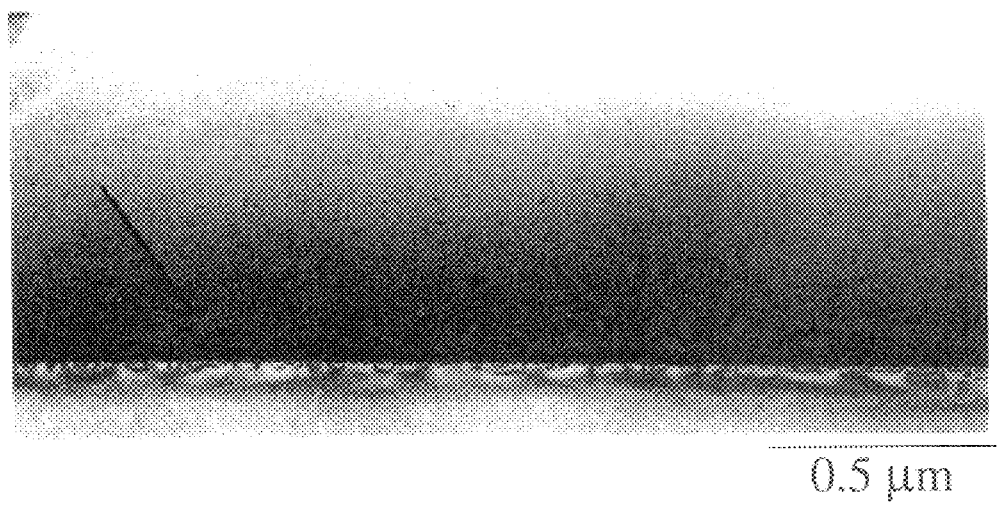
FIG. 5 is a cross-sectional TEM of a Ge epi-layer grown on a Si substrate, after undergoing a cyclic thermal annealing process provided by the invention.

FIG. 5 is a cross-sectional TEM of the Ge epi-layer after the annealing process. Note the dramatic reduction in dislocation density between this layer, after the cyclic anneal, compared with that of the layer shown in the TEM of FIG. 1, which was not cyclic annealed. Note also that the structure of the threading dislocations remaining in the layer shown in the TEM of FIG. 5 is very different from that of the threading dislocations of the layer shown in the TEM of FIG. 1. The threading dislocations in FIG. 5 are glissile, while as explained above, those in the un-annealed layer are sessile. This comparison demonstrates that the cyclic anneal of the invention indeed transforms sessile dislocations to glissile dislocations. Given the glissile dislocation glide and annihilation mechanisms enabled by the invention, it is understood that the glissile dislocations that remain in the material shown in the TEM of FIG. 5 can be further reduced by additional thermal annealing cycles.

Such a transformation of sessile threading dislocations to glissile threading dislocations by an annealing step has conventionally been understood to be impossible. Specifically, it has been conventionally understood that sessile threading dislocations are energetically more stable than glissile threading dislocations. It has also been generally understood that thermal cycling to induce glide of glissile dislocations could not reduce threading dislocation density because the reaction product of two glissile threading dislocations that meet each other was understood to be a sessile threading dislocation that could not be removed. The TEM's of FIGS. 1 and 5 show that this is not the case. The inventors herein have discovered that in a Ge epi-layer, sessile dislocations can be transformed to glissile dislocations by annealing, and that the reaction of two gliding dislocations is annihilation rather than the formation of a sessile dislocation.

It is also important to note that in the Ge epi-layer in the TEM of FIG. 5, the entire material extent between the top Ge surface and the Ge/Si interface is substantially free of defects. This very high material quality through the thickness of the layer has not been generally achievable by prior growth techniques.

EXAMPLES 2–8

A Ge epi-layer of about 1 µm in thickness was grown on each of seven silicon substrates by the UHV/CVD process of Example 1. Six of the substrates were each then subjected to a distinct cyclic anneal process as given below; one substrate was not annealed at all. Each Ge epi-layer was then examined by plan-view TEM with JEOL 2000FX and JEOL 2010 transmission electron microscopes to determine threading dislocation density. The microscope magnification was calibrated using a diffraction grating replica.

Table 1 below identifies for each of the six Ge epi-layer anneal processes employed the temperature and duration of the high-temperature and low-temperature stages of each cycle, the duration of each cycle stage, and the number of cycles completed. The measured threading dislocation density is also given for each cycle. The error bars given for each measurement are the 95% confidence intervals of the average dislocation densities.

TABLE 1

| $T_H$ (° C.)/ $D_H$ (min) | $T_L$ (° C.)/ $D_H$ (min) | Number of Anneal Cycles | Threading Dislocation Density (cm$^{-2}$) |
| --- | --- | --- | --- |
| A  NA | NA | NA | $(9.5 \pm 0.4) \times 10^8$ |
| B  900° C./10 min | 100° C./10 min | 1 | $(7.9 \pm 0.6) \times 10^7$ |
| C  900° C./100 min | 100° C./10 min | 1 | $(7.8 \pm 0.5) \times 10^7$ |
| D  900° C./10 min | 100° C./10 min | 10 | $(5.2 \pm 0.6) \times 10^7$ |
| E  900° C./10 min | 675° C./10 min | 10 | $(4.2 \pm 0.1) \times 10^7$ |
| F  900° C./100 min | 780° C./10 min | 5 | $(2.7 \pm 0.1) \times 10^7$ |
| G  900° C./5 min | 780° C./5 min | 20 | $(1.6 \pm 0.1) \times 10^7$ |

This data indicates the dramatic reduction in dislocation density enabled by the processes of the invention. The un-annealed Ge epi-layer, sample A, is characterized by a threading dislocation density on the order of about $10^9$ cm$^{-2}$ while the sample annealed during 20 cycles, sample G, is characterized by a dislocation density of only about $1\sim2\times10^7$ cm$^{-2}$. A comparison of the threading dislocation densities of samples B, C, and D indicates that an increase in the number of annealing cycles is more effective in reducing dislocations than an increase in the high-temperature stage duration, $D_H$, at 900° C. A comparison of the threading dislocation densities of samples D, E, and F indicates that an increase in the low-temperature stage temperature, $T_L$, toward the optimized low anneal temperature for Ge, of about 830° reduces dislocations in the manner predicted by the glide velocity analysis given above.

EXAMPLES 9–11

Figure 6:
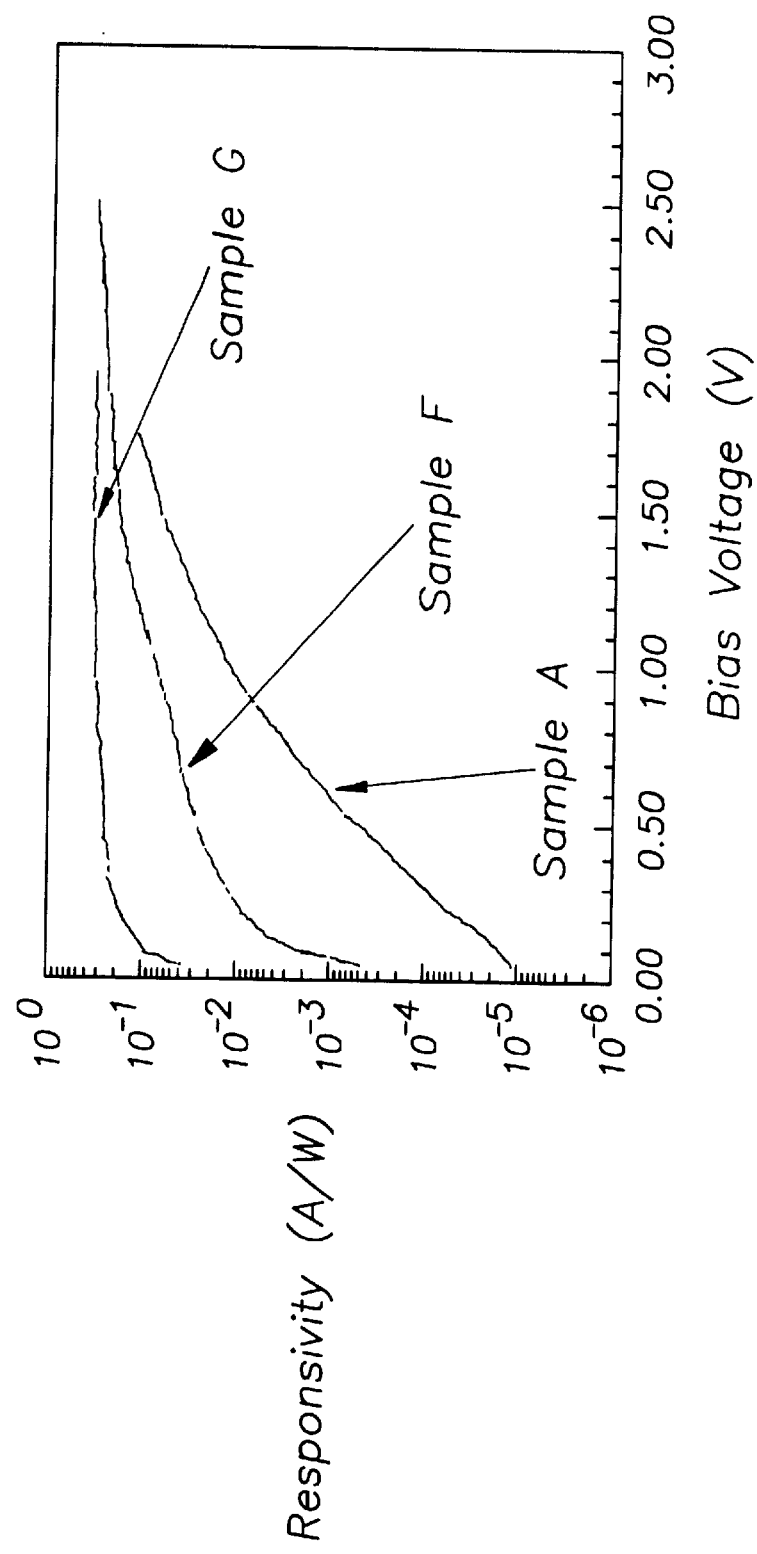
FIG. 6 is a plot of responsivity as a function of bias voltage for a Ge photodetector fabricated in a Ge epi-layer processed in accordance with the invention, for three cyclic annealing processes.

To determine the effect of the dislocation reduction achieved in accordance with the invention on photodetector performance, metal-semiconductor-metal photodetectors were fabricated from the Ge epi-layer samples A, F, and G from Examples 2–8 above. FIG. 6 is a plot of measured photodetector responsivity at the 1.3 μm detection wavelength as a function of bias voltage for each of the three sample materials. An improvement in the photodetector performance with the number of annealing cycles is clearly demonstrated. Also indicated by the plotted data is an improvement in responsivity as the bias voltage is increased. This improvement is achieved due to an increase in photo-generated carrier collection efficiency with increasing bias voltage. Further indicated by the plotted data is that an increase in number of annealing cycles results in reaching of maximum responsivity at lower bias voltage. This is due to the enhanced carrier mobility and lifetime produced by increases in anneal cycles.

EXAMPLE 12

Ge epi-layers were grown selectively as mesas on exposed Si wafer areas through a patterned SiO$_2$ layer on Si wafers. In this experiment, the SiO$_2$ layer was grown on Si wafers by wet oxidation at 950° C. The SiO$_2$ layer was patterned using optical photolithography. Windows in the SiO$_2$ layer were etched with a buffered oxide etch solution to expose Si wafer areas for selective epitaxial growth on those areas. Ge was selectively grown with the process employed in Example 1.

Figure 7A:
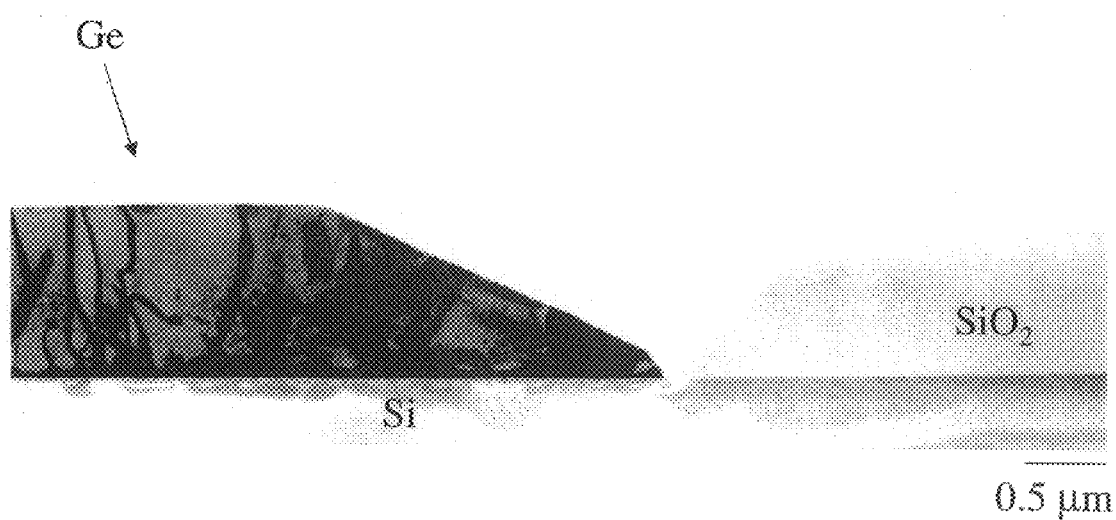
FIGS. 7A–7B are cross-sectional TEMs of a Ge epi-layer mesa as-grown and after a cyclic thermal annealing process provided by the invention, respectively.

FIG. 7A is a cross-sectional TEM of a Ge epi-layer mesa adjacent to an SiO$_2$ dislocation sink area after epi-layer growth. It is clear from the TEM that the Ge grew selectively on Si and did not grow on the SiO$_2$ regions. It is also evident that there exists a high density of threading dislocations in the Ge epi-layer mesa, to a degree commensurate with that observable in the layer shown in FIG. 1.

Cyclic annealing of Ge epi-layer mesas on a silicon wafer was then carried out. A high-temperature stage temperature, $T_H$, of about 900° C. and duration, $D_H$, of about 10 minutes, and a low temperature stage temperature, $T_L$, of about 100° C. and duration, $D_L$, of about 10 minutes, was employed, for 10 cycles.

Figure 7B:
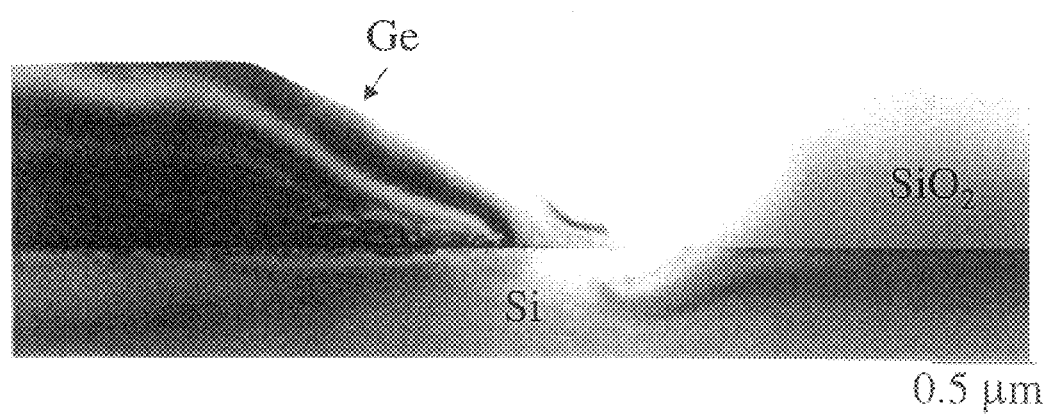

FIG. 7B is a cross-sectional TEM of a Ge epi-layer mesa, adjacent to an SiO$_2$ sink region, after the anneal process. The Ge epi-layer mesa shows a dramatic reduction in dislocation density over that shown in FIG. 7A, verifying that in the case of small Ge regions selectively grown on patterned SiO$_2$/Si wafers, threading dislocation glide from the Ge regions to adjacent SiO$_2$ regions can be induced by the thermal stress of a cyclic annealing process. As a result, Ge regions with very few or substantially no threading dislocations can be obtained on Si by the processes provided by the invention.

EXAMPLES 13–14

Ge epi-layers were grown selectively as mesas on exposed Si wafer areas through a patterned SiO$_2$ layer, following the process given in Example 12. The SiO$_2$ layer pattern was square, having a 10 μm edge length. One wafer was annealed at a temperature of about 900° C. for about 10 min, and then cooled. A second wafer was cyclically annealed at a high-temperature stage temperature, $T_H$, of about 900° C. and duration, $D_H$, of 10 minutes, and a low temperature stage temperature, $T_L$, of about 100° C. and duration, $D_L$, of about 10 minutes, for 10 cycles.

The dislocation densities of the samples were determined by etch-pit-density counting (EPD) techniques. Measurement of threading dislocation densities by EPD is generally necessary for threading dislocation densities below about $10^6$ cm$^{-2}$, where measurements by plan-view TEM are statistically unsound.

Figure 8A:
FIGS. 8A–8B are optical micrographs of Ge epi-layer mesas after a single thermal anneal cycle and after multiple thermal anneal cycles, respectively, in accordance with the invention.
Figure 8B:
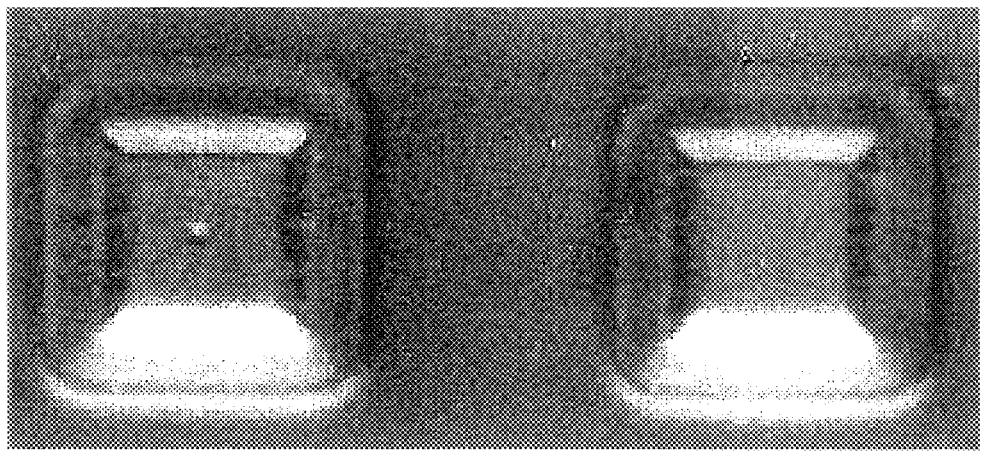

FIG. 8A is an optical micrograph of two Ge mesas after the single 10 minute high-temperature stage anneal and then cool-down. The average EPD for this sample was measured as about $(4.3\pm0.2)\times10^7$ cm$^{-2}$. FIG. 8B is an optical micrograph of two Ge mesas after the 10-cycle annealing process. The average EPD for this sample was measured as about $2.3\pm0.2\times10^6$ cm$^{-2}$, a dramatic reduction over the first sample. Of particular note, the Ge mesa to the right in FIG. 8B was found to be completely free of threading-dislocations. Many threading dislocation-free Ge mesas were found in other samples processed for this same experiment. This result was also verified by atomic force microscopy. The ability of the EPD counting technique to detect a reduction in threading-dislocation density with increasing number of annealing cycles validates its effectiveness.

EXAMPLE 15

Ge epi-layers were grown selectively as mesas on exposed Si wafer areas through a patterned SiO$_2$ layer, following the process given in Example 12. The SiO$_2$ layer pattern was square. Four different edge lengths, namely, 100 μm, 48 μm, 31 μm, and 18 μm, were fabricated.

Figure 9:
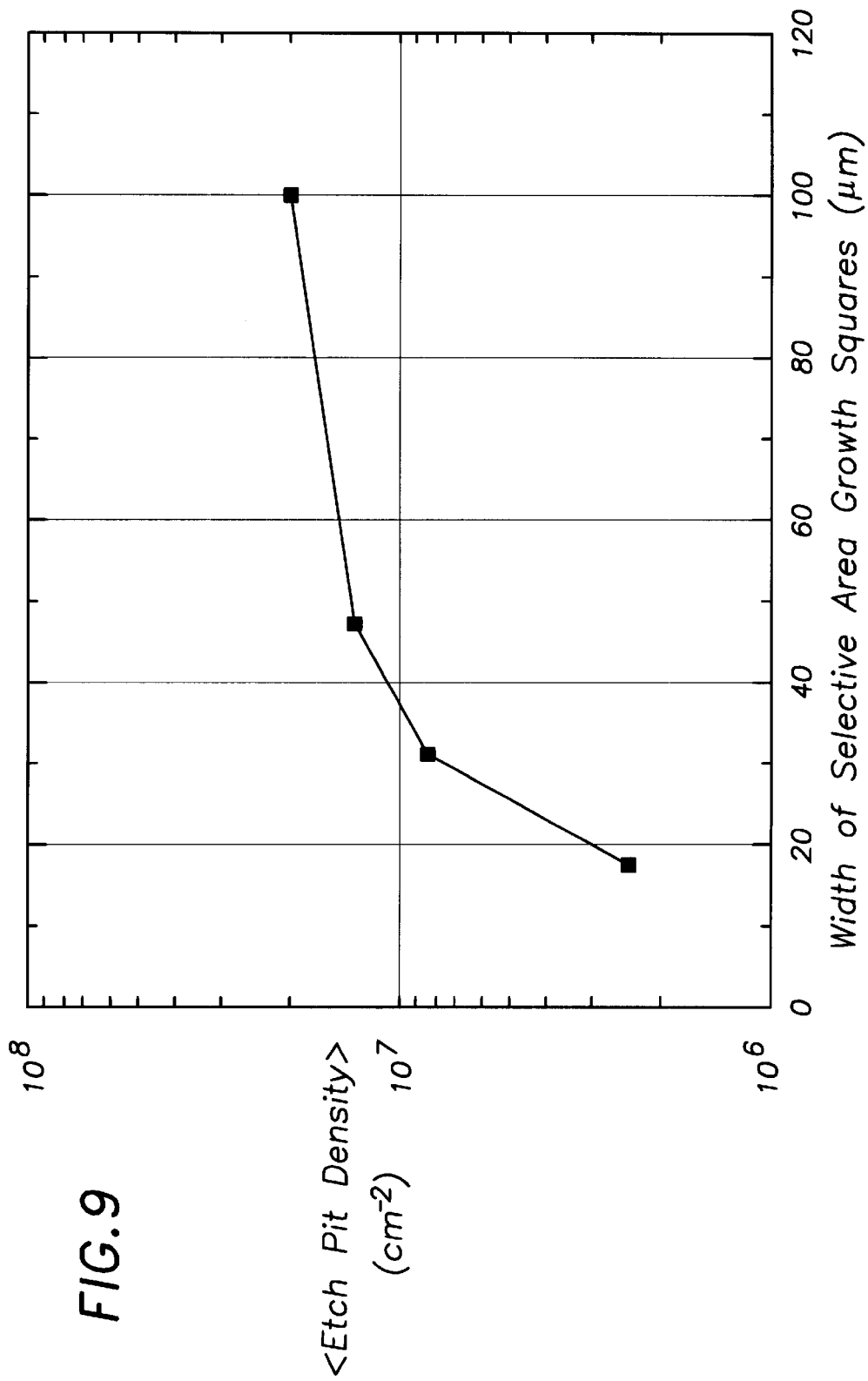
FIG. 9 is a plot of average etch pit density of a Ge epi-layer mesa as a function of the edge length of a square Ge epi-layer mesa after the cyclic thermal anneal process of the invention.

FIG. 9 is a plot of average EPD count as a function of square mesa edge length. The plotted data clearly indicate that the average threading dislocation density decreases with a decrease in mesa edge length. This experimental result validates the understanding that as the extent of a mesa is decreased, whereby the distance through which a dislocation must travel to reach a dislocation sink is reduced, the population of dislocations that can glide completely out of the mesa to the sink increases.

Figure 10:
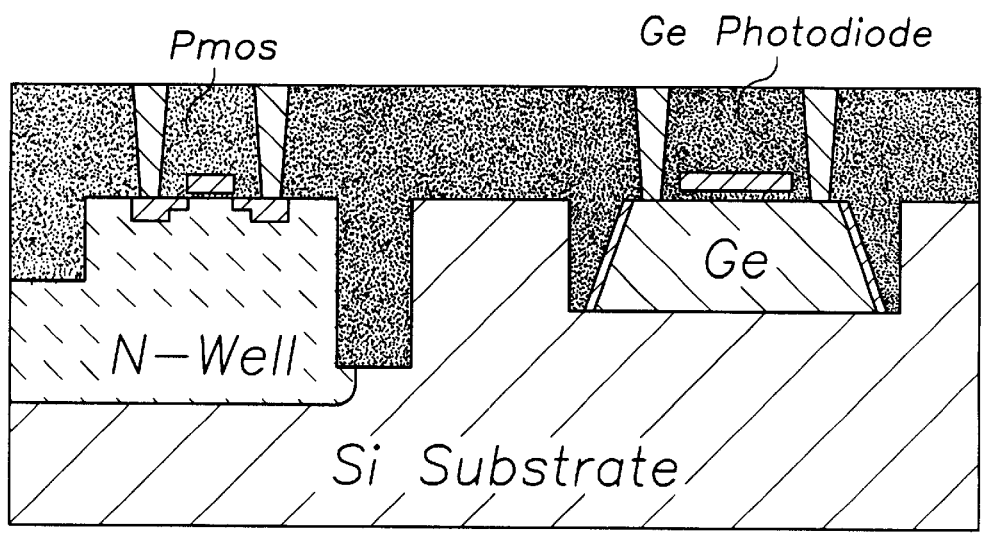
FIG. 10 is a schematic cross-sectional diagram of a lateral Ge photodetector integrated with Si CMOS electronics, in accordance with the invention.

The processes of the invention can be applied to the integration of any devices that require a high-quality III–V or II–VI layer, e.g., a Ge epi-layer, on a silicon substrate. For example, as shown schematically in FIG. 10, a lateral Ge photodetector integrated with a Si CMOS process is enabled by the low dislocation, thin Ge epi-layer produced in accordance with the invention. In the configuration shown, the Ge lateral photodetector is integrated with Si CMOS devices and with a polysilicon waveguide utilizing a shallow trench isolation process. Dopants are incorporated into Ge by diffusion or ion implantation. Surface planarity is achieved by, e.g., a conventional chemomechanical polishing (CMP) process. A layer of silicon is utilized as a protective layer for the Ge layer and also as a nucleation layer for the polysilicon waveguide. Fabrication of such a structure is taught by Luan et al. in the co-pending application entitled, "Oxidation of Silicon on Germanium," U.S. Ser. No. 09/603,269, filed on even date herewith, now issued as U.S. Pat. No. 6,352,942, and incorporated in its entirety by reference. The configuration of FIG. 10 also enables integration of Ge MOSFETs with Si MOSFETs.

Figure 11:
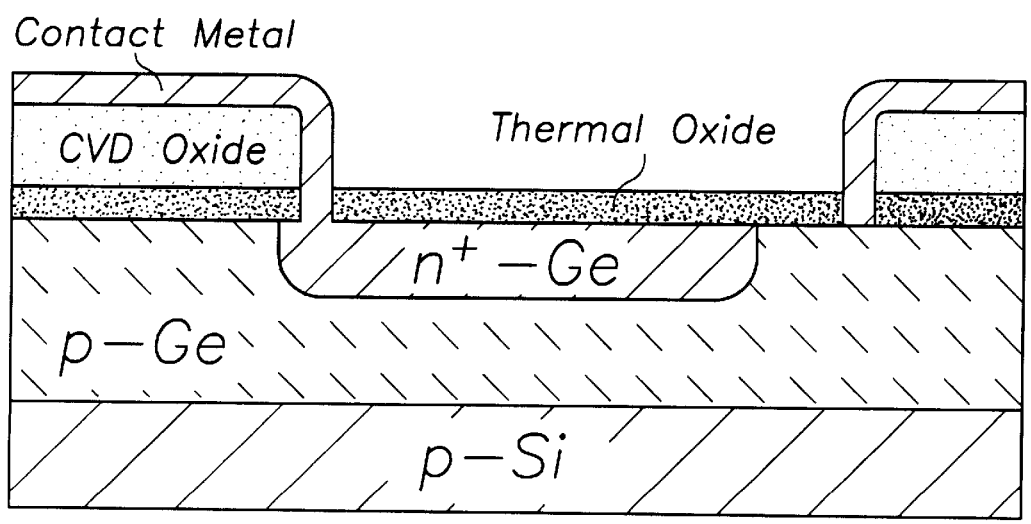
FIG. 11 is a schematic cross-sectional diagram of a vertical Ge PIN photodetector integrated on a silicon substrate.

A further example is schematically shown in FIG. 11. Here a Ge vertical PIN photodetector is integrated on a silicon substrate. A layer of silicon as described above is here employed as a protective layer for the Ge layer. A P-N junction can be obtained by conventional dopant diffusion or ion implantation.

These examples illustrate a few of the devices and configurations enabled by the high quality Ge layers produced in accordance with the invention. As stated earlier, for clarity the discussion has focussed on Ge epi-layer growth, but the invention is not limited to such. The processes of the invention can also be applied to, e.g., indium gallium arsenide epi-layers produced on indium phosphide substrates, and GaAs on Si, InGaAs on Si, AlGaAs on Si, GaP on Si, AlGaP on Si, GaN on Si, AlN on Si, AlGaN on Si, InN on Si, and alloys of various III–V and II–VI compounds and III–N nitride compound semiconductors.

The processes of the invention enable, in contrast to conventional expectation, transformation of sessile threading dislocations formed during the epi-layer growth into glissile threading dislocations by cyclic thermal annealing between a temperature higher than the epi-layer growth temperature, preferably close to the epi-layer melting temperature, and a lower temperature. The invention further provides two methods for the reduction of the density of the transformed glissile threading dislocations. In a process where the epi-layer is grown on a bare wafer, the cyclic thermal annealing process of the invention produces thermal stress-induced dislocation glide. It is discovered by the inventors herein that in contrast to conventional understanding, glissile dislocation annihilation is enabled by this cyclic thermal annealing to reduce threading dislocation density. In a process where the epi-layer is selectively grown as mesas on bare wafer surfaces exposed in openings in a patterned surface layer, the cyclic thermal annealing process provided by the invention enables the glissile dislocation annihilation described above, and further enables the dislocations to glide to the relatively near sidewalls of the mesas. In this scenario employing the selective growth of epi-layer mesas, it is possible, in accordance with the invention, to produce substantially threading dislocation-free mesas, e.g., Ge mesas, on an substrate such as a Si wafer. Because this dramatic dislocation reduction is produced by the invention in epi-layers as thick as 10 μm or more and as thin as 1 μm or less, practical and cost effective integration of such epi-layers with conventional silicon microfabrication processes is enabled.

It is recognized, of course, that those skilled in the art may make various modifications and additions to the processes of the invention without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. A method for reducing dislocation density in a semiconductor material formed as an epitaxial layer upon a dissimilar substrate material, the method comprising:

heating the epitaxial layer and the substrate at a heating temperature that is less than about a characteristic temperature of melting of the epitaxial layer but greater than about a temperature above which the epitaxial layer is characterized by plasticity, for a first time duration;

cooling the epitaxial layer and the substrate at a cooling temperature that is lower than about the heating temperature and that is selected to maximize thermally-induced glide of dislocations and to minimize glide limitation by a glide energy barrier characteristic of the epitaxial layer, for a second time duration; and carrying out the heating and cooling a selected number of cycles to reduce the dislocation density of the epitaxial layer.

2. The method of claim 1 wherein the cooling temperature is at least about 50° C. less than the heating temperature.

3. The method of claim 1 wherein the epitaxial layer comprises a III–V material.

4. The method of claim 1 wherein the epitaxial layer comprises a II–VI material.

5. A method for reducing dislocation density in an epitaxial layer comprising germanium provided on a silicon substrate, the method comprising:

heating the epitaxial layer and the substrate at a heating temperature that is less than about a characteristic temperature of melting of the epitaxial layer but greater than about a temperature above which the epitaxial layer is characterized by plasticity, for a first time duration;

cooling the epitaxial layer and the substrate at a cooling temperature that is lower than about the heating temperature and that is between about 700° C. and about 900° C., for a second time duration; and carrying out the heating and cooling a selected number of cycles to reduce the dislocation density of the epitaxial.

6. The method of claim 5 wherein the heating temperature is at least about 900° C.

7. The method of claim 6 wherein the number of cycles for which the heating and cooling is carried out is selected to produce a dislocation density no greater than about $2 \times 10^7$ cm$^{-2}$.

8. A method for reducing dislocation density in an epitaxial layer comprising germanium, provided on a silicon substrate, the epitaxial layer comprising at least one germanium epitaxial mesa adjacent to which is provided a dislocation sink material comprising silicon dioxide, the method comprising:

heating the epitaxial layer and the substrate at a heating temperature that is less than about a characteristic temperature of melting of the epitaxial layer but greater than about a temperature above which the epitaxial layer is characterized by plasticity, for a first time duration;

cooling the epitaxial layer and the substrate at a cooling temperature that is lower than about the heating temperature, for a second time duration; and carrying out the heating and cooling a selected number of cycles to reduce the dislocation density of the epitaxial layer.

9. The method of claim 8 wherein the epitaxial mesa comprises a circular mesa.

10. The method of claim 8 wherein the epitaxial mesa comprises a square mesa.

11. The method of claim 10 wherein the epitaxial mesa is characterized by an extent that is less than about 20 microns.

12. The method of claim 8 wherein the number of cycles for which the heating and cooling is carried out is selected to produce a substantially zero dislocation density in the mesa.

13. The method of claim 8 wherein the epitaxial layer comprises at least one epitaxial mesa characterized by an extent that is between about 2 $\mu$m and about 100 $\mu$m, and adjacent to which is provided a dislocation sink material.

14. The method of claim 8 further comprising a step of fabricating silicon devices on the silicon substrate.

15. A method for reducing dislocation density in an epitaxial layer comprising germanium provided on a silicon substrate, the method comprising:

forming a lower portion of the epitaxial layer by chemical vapor deposition at a first deposition temperature with a deposition gas comprising germanium bonded to hydrogen, for a first deposition duration selected to form at least a mono-epitaxial layer, and then forming an upper portion of the epitaxial layer by chemical vapor deposition at a second deposition temperature, higher than the first deposition temperature, with the deposition gas, for a second deposition duration;

heating the epitaxial layer and the substrate at a heating temperature that is less than about a characteristic temperature of melting of the epitaxial layer but greater than about a temperature above which the epitaxial layer is characterized by plasticity, for a first duration;

cooling the epitaxial layer and the substrate at a cooling temperature that is lower than about the heating temperature, for a second duration; and carrying out the heating and cooling a selected number of cycles to reduce the dislocation density of the epitaxial layer.

16. The method of claim 15 wherein the heating temperature is no less than about 10% below the characteristic melting temperature of the epitaxial layer.

17. The method of claim 15 wherein the heating temperature is no less than about 100° C. below the characteristic melting temperature of the epitaxial layer.

18. The method of claims 17 wherein the heating temperature is no less than about 50° C. below the characteristic melting temperature of the epitaxial layer.

19. The method of claim 18 wherein the heating temperature is no less than about 10° C. below the characteristic melting temperature of the epitaxial layer.

20. The method of claim 15 wherein the selected number of cycles for which the heating and cooling is carried out is between one and twenty cycles.

21. The method of claim 15 wherein the first duration and the selected number of cycles for which the heating and cooling is carried out are each less than that at which substantial material diffusion between the substrate and epitaxial layer materials would occur.

22. The method of claim 15 wherein the first and second time durations are substantially equal.

23. The method of claim 15 wherein each of the first and second time durations is at least as long as a characteristic duration required for the epitaxial layer and the substrate to reach thermal equilibrium.

24. The method of claim 15 wherein the heating and cooling is carried out in an inert atmosphere.

25. The method of claim 15 wherein the epitaxial layer is no more than about 1 micron in thickness.

26. The method of claim 15 wherein the epitaxial layer is between about 1 $\mu$m and about 10 $\mu$m in thickness.

27. The method of claim 15 further comprising a step of fabricating a lateral photodetector in the epitaxial layer.

28. The method of claim 15 further comprising a step of fabricating a vertical photodetector in the epitaxial layer.

29. A method for reducing dislocation density in a semiconductor material formed as an epitaxial layer upon a dissimilar substrate material, the method comprising:

heating the epitaxial layer and the substrate at a heating temperature that is less than about a characteristic temperature of melting of the epitaxial layer but greater than about a temperature above which the epitaxial layer is characterized by plasticity, for a first time duration;

cooling the epitaxial layer and the substrate for a second time duration, at a cooling temperature that is lower than about the heating temperature, wherein the cooling temperature, $T_L$, is selected to maximize glide velocity, $V_{dislocation}$, of epitaxial layer dislocations, where $$V_{dislocation} \propto (\alpha_{Sub} - \alpha_{Epi}) \cdot (T_H - T_L) \cdot \exp\left(-\frac{E_v}{kT_L}\right),$$

for a given heating temperature, $T_H$, where $\alpha_{Sub}$ and $\alpha_{Epi}$ are coefficients of thermal expansion characteristic of the substrate and the epitaxial layer, respectively, $E_U$, is an energy barrier to dislocation glide, and k is Boltzmann's constant; and carrying out the heating and cooling a selected number of cycles to reduce the dislocation density of the epitaxial layer.

* * * * *